(12) United States Patent
Brems et al.

(10) Patent No.: US 8,197,604 B2
(45) Date of Patent: Jun. 12, 2012

(54) METHOD AND APPARATUS FOR CONTROLLING OPTIMAL OPERATION OF ACOUSTIC CLEANING

(75) Inventors: Steven Brems, Kessel-Lo (BE); Paul Mertens, Bonheiden (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/827,951

(22) Filed: Jun. 30, 2010

(65) Prior Publication Data

US 2011/0000504 A1      Jan. 6, 2011

Related U.S. Application Data

(60) Provisional application No. 61/222,712, filed on Jul. 2, 2009.

(51) Int. Cl.
*B08B 3/04* (2006.01)
(52) U.S. Cl. .............. 134/1.3; 134/1; 134/18; 134/25.4; 134/26; 134/32; 134/33; 134/42; 134/902
(58) Field of Classification Search ................. 134/1, 18, 134/25.4, 26, 32, 33, 42, 902, 1.3
See application file for complete search history.

(56) References Cited

U.S. PATENT DOCUMENTS

| 5,739,724 | A | 4/1998 | Alexandre et al. |
| 2002/0036444 | A1 | 3/2002 | Yamashiro et al. |
| 2006/0060991 | A1* | 3/2006 | Holsteyns et al. ............ 261/81 |
| 2007/0169800 | A1* | 7/2007 | Fani et al. ................ 134/56 R |
| 2008/0149150 | A1* | 6/2008 | Hausen ...................... 134/184 |

FOREIGN PATENT DOCUMENTS

| JP | 406091239 A | * | 4/1994 |
| JP | 2001-334221 | | 12/2001 |
| WO | WO2004/071938 | | 8/2004 |
| WO | WO2008/138725 | * | 11/2008 |

OTHER PUBLICATIONS

Yi, J.H. et al., "Robust Force Control for a Magnetically Levitated Manipulator Using Flux Density Measurement", Control Eng. Practice, vol. 4, No. 7, 1996, pp. 957-965.
Lin, Chern-Sheng et al., "The Laser Displacement Measurement with Feedback Control in a Magnetic Levitation and Suspension System", Comput. Methods Appl. Mech. Engrg., vol. 190, 2000, pp. 25-34.

* cited by examiner

*Primary Examiner* — Bibi Carrillo
(74) *Attorney, Agent, or Firm* — McDonnell Boehnen Hulbert & Berghoff LLP

(57) ABSTRACT

Methods and apparatuses for cleaning a surface of a substrate are presented. The method comprises positioning a substrate at a controllable distance from a piezoelectric transducer, supplying a cleaning liquid between the substrate and the transducer, applying an oscillating acoustic force to the cleaning liquid by actuating the transducer, and moving the transducer relative to the substrate. The method further comprises, while moving the transducer relative to the substrate, measuring a value that indicates a distance between a surface of the substrate and the transducer, comparing the measured value to a desired value, and adjusting the distance between the surface and the transducer so that the measured value is maintained substantially equal to the desired value. The measured value may be the distance between the surface of the substrate and the transducer or a phase shift between an alternating current and voltage applied to the transducer.

12 Claims, 6 Drawing Sheets

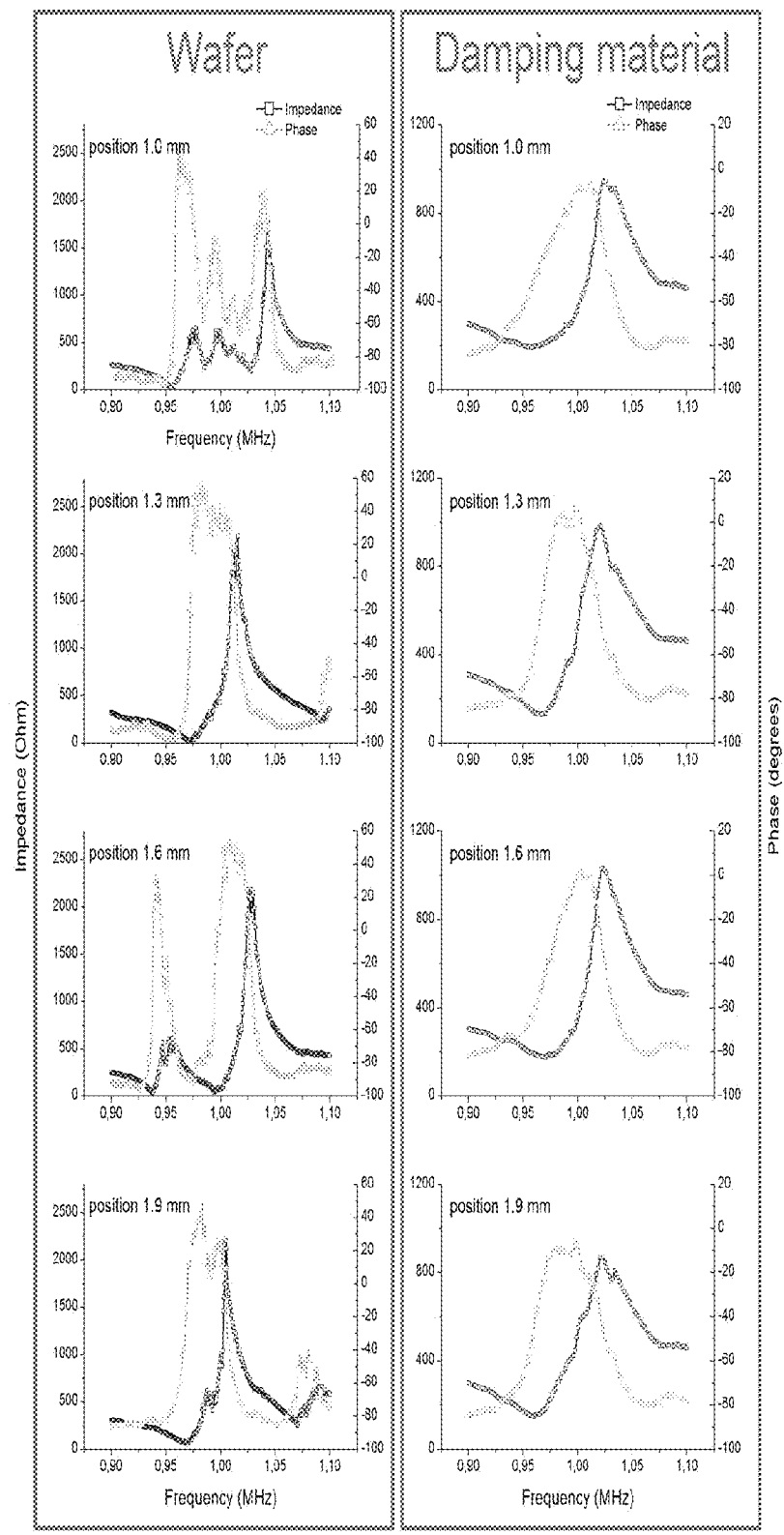
FIGURE 2A FIGURE 2B

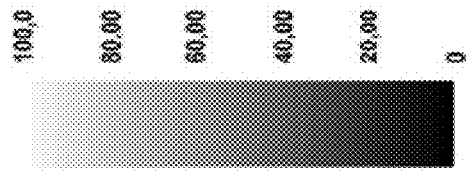
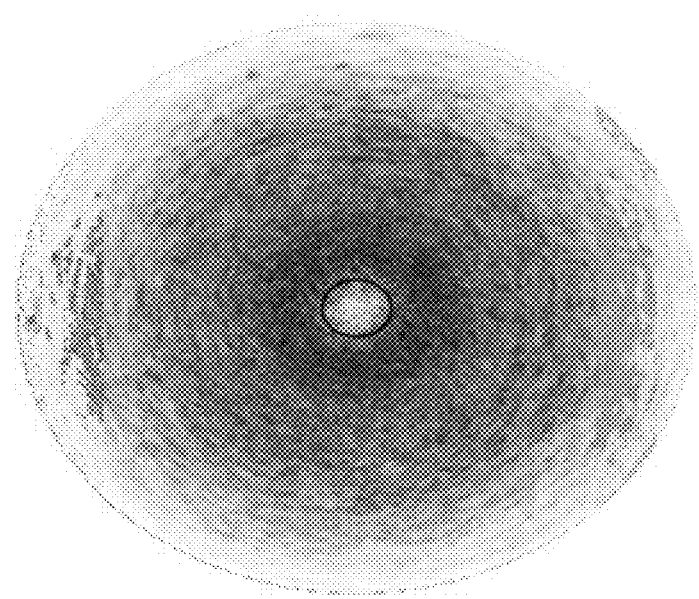
FIGURE 6B
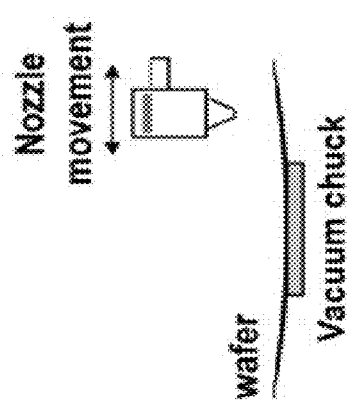
FIGURE 6A

METHOD AND APPARATUS FOR CONTROLLING OPTIMAL OPERATION OF ACOUSTIC CLEANING

CROSS-REFERENCE TO RELATED APPLICATIONS

This application claims priority to U.S. Provisional Application Ser. No. 61/222,712 filed Jul. 2, 2009, the contents of which are incorporated by reference herein in its entirety.

TECHNICAL FIELD OF THE INVENTION

The present invention is related to methods and apparatuses for cleaning a substrate, in particular a semiconductor substrate, using megasonic energy.

BACKGROUND OF THE INVENTION

Megasonic cleaning techniques are known in the art and are presently widely applied in the semiconductor industry. The performance of megasonic cleaning depends on several process parameters such as frequency, dissolved gas in the cleaning liquid, applied power, acoustic field geometry, refreshing of the cleaning liquid, wafer positions, and chemical concentrations. Despite the wide application of megasonic cleaning, the importance of each individual process parameter is still not sufficiently clear.

Even the physical mechanisms that are responsible for the removal of particles (such as Schlichting streaming, microstreaming and acoustic cavitation) are still under debate, for at least the reason that basic physical processes and forces involved in the cleaning process are little understood. All these uncertainties make it very difficult to optimize megasonic cleaning tools to the ever more stringent requirements of the semiconductor industry. The process window of physical forces in which structures can be cleaned without creating damage is continuously narrowing. As a result, a precise control over the physical forces during megasonic cleaning is extremely important.

In WIPO Application Pub. No. WO-A-2004071938 (Boyd et al.), a method and apparatus are disclosed involving a megasonic transducer oriented towards a substrate. A dynamically adjustable RF generator is provided that has an output coupled to the transducer, and the RF generator is adjusted to maintain a resonance state of the transducer, thereby obtaining improved cleaning efficiency. While this approach provides an improvement over systems wherein no such control is applied, a further optimization is desirable.

The present invention aims to provide further improvement over the systems described above.

SUMMARY OF THE INVENTION

At least some embodiments of the present disclosure are methods and apparatuses for cleaning a surface of a substrate. In particular, the substrate may be a semiconductor substrate, such as a silicon wafer. In some embodiments, the method may involve positioning a substrate at a controllable distance from a piezoelectric transducer, supplying a cleaning liquid between the substrate and the transducer, applying an oscillating acoustic force to the cleaning liquid by actuating the transducer, and moving the transducer relative to the substrate. The method further comprises, while moving the transducer relative to the substrate, measuring a value that indicates a distance between a surface of the substrate and the transducer, comparing the measured value to a desired value, and adjusting the distance between the surface and the transducer so that the measured value is maintained substantially equal to the desired value.

In some embodiments, the measured value may be the distance between the surface of the substrate and the transducer. In these embodiments, the desired value may be the distance at which the particle removal efficiency (PRE) is at a maximum. In some embodiments, measuring the distance between the surface and the transducer may comprise using an optical sensor and a laser to measure the distance.

In some embodiments, applying an oscillating acoustic force to the cleaning liquid by actuating the transducer may comprise applying an alternating current and voltage to the transducer. In some embodiments, the frequency of the alternating current and voltage is kept substantially constant.

In some embodiments, the measured value may be a phase shift between the alternating current and voltage applied to the transducer. In these embodiments, the desired value may be a desired phase shift, such as zero.

In some embodiments, the transducer may be mounted in a nozzle. The nozzle may be operable to produce a liquid column between the nozzle and the surface. In other embodiments, the transducer may be mounted against a sidewall of a reservoir configured to be filled with the cleaning liquid and to receive the substrate for submersion in the cleaning liquid.

In some embodiments, moving the transducer relative to the substrate may comprise moving the transducer, and alternately or additionally moving the substrate relative to the transducer. For example, the substrate may be rotated.

This disclosure is equally related to an apparatus for cleaning a surface of a substrate. In some embodiments, the apparatus may comprise a piezoelectric transducer, a support operable to position a substrate at a controllable distance from the transducer, means for providing a cleaning liquid between the transducer and the substrate, means for measuring a value indicating a distance between a surface of the substrate and the transducer, and a feedback loop operable to control the measured value such that the measured value remains substantially equal to a desired value.

In some embodiments, the means for providing the cleaning liquid may comprise a nozzle. In these embodiments, the transducer may be mounted in the nozzle, and the nozzle may be operable to produce a liquid column between the nozzle and the surface.

In other embodiments, the means for providing the cleaning liquid may comprise a reservoir in which the substrate may be submerged. In these embodiments, the transducer may be attached to a sidewall of the reservoir.

In some embodiments, the means for measuring the value indicating a distance between the surface of the substrate and the transducer comprises an optical sensor and a laser. In some embodiments, the measured value is the distance between the surface of the substrate and the transducer, and the desired value is the distance at which the PRE is at a maximum.

In some embodiments, the transducer is operable to receive an alternating current and voltage from a power source so as to actuate the transducer and apply an oscillating acoustic force to the cleaning liquid. In some embodiments, the measured value may be a phase shift between the alternating current and voltage, and the desired value may be a desired phase shift, such as zero.

The embodiments disclosed, however, both as to organization and method of operation, together with features and advantages thereof, may best be understood by reference to the following detailed description when read with the accompanying drawings.

BRIEF DESCRIPTION OF THE DRAWINGS

FIG. 1 is a schematic representation of the experimental setups discussed in the disclosure.

FIG. 2 shows the impedance and phase measurements of the transducer as a function of the frequency. FIG. 2A shows graphs when a wafer is inserted at 4 different distances from the transducer. FIG. 2B shows the same measurements when the wafer is replaced by a piece of damping material.

FIG. 4 shows the frequencies that correspond to a zero phase shift between the voltage and current signals as a function of the distance between the sample and the wafer.

FIG. 6 shows a nozzle setup as well as a pattern obtained with the nozzle setup. FIG. 6A illustrates a cross section of the nozzle set-up in accordance with an embodiment of the invention. FIG. 6B represents a typical non-uniform particle removal efficiency (PRE) pattern obtained with a nozzle set-up.

FIG. 7 shows experimental data related to real power PRE.

DETAILED DESCRIPTION

Figure 1A:
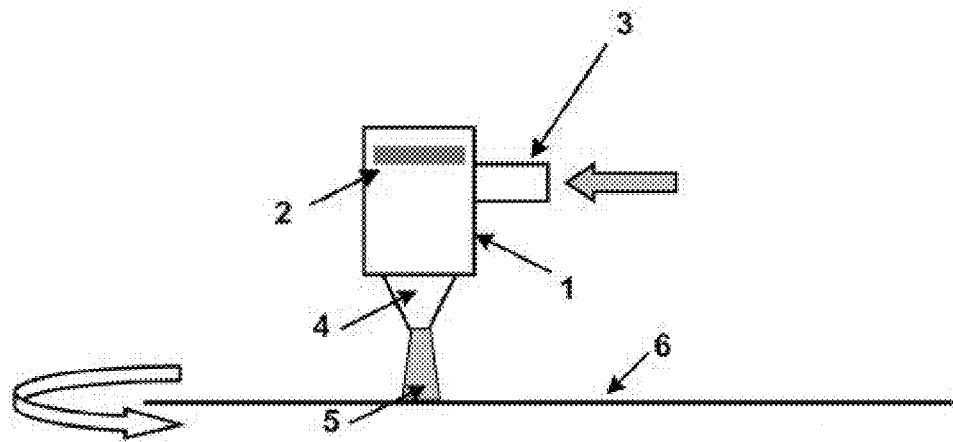
FIG. 1A depicts a nozzle system.

A method and apparatus are disclosed for controlling the performance of acoustic cleaning. The method is useful for megasonic cleaning tools that involve a face-to-face configuration of an acoustic transducer and substrate or wafer. The method comprises controlling a distance between the transducer and the substrate according to the teaching of the present disclosure, thereby leading to improved cleaning performance. One measure of the cleaning performance is the Particle Removal Efficiency (PRE).

Megasonic transducers make use of a piezoelectric material operable to convert between mechanical vibrations and electrical energy. Often, acoustic field geometry can have a large impact on the performance of megasonic transducers. A reflection of acoustic waves back into a transducer imposes mechanical constraints on the piezoelectric material of the transducer. This effect can be described with electrical and stress-strain relationships, which are applicable to piezoelectric materials:

$$D_i = \epsilon_{ij} E_j + e_{ijk} T_{jk} \quad (1)$$

$$\sigma_{ij} = e_{ijk} E_k + s_{ijkl} T_{kl} \quad (2)$$

In eq. (1) and (2) D is the electrical displacement, $\sigma_{ij}$ is the strain field, E is the electrical field, T is the stress field, e is defined as the piezo-electrical strain constants and $\epsilon$ and s describe the dielectric and elastic properties under conditions of constant stress and constant electric field, respectively.

A confinement of piezoelectric material, when an electric field is applied, results in stress, as shown by eq. 2. This stress contributes to the electrical displacement and changes the relation between E and D. As a result of this relationship, acoustic reflections back into a transducer can change the electrical behaviour of a transducer.

The method disclosed herein involves positioning a substrate at a controllable distance from a piezoelectric transducer, supplying a cleaning liquid between the substrate and the transducer, applying an oscillating acoustic force to the cleaning liquid by actuating the transducer, and moving the transducer relative to the substrate. The method further comprises, while moving the transducer relative to the substrate, measuring a value that indicates a distance between a surface of the substrate and the transducer, comparing the measured value to a desired value, and adjusting the distance between the surface and the transducer so that the measured value is maintained substantially equal to the desired value.

In some embodiments, the measured value may be the distance between the surface of the substrate and the transducer. In these embodiments, the desired value may be the distance at which the particle removal efficiency (PRE) is at a maximum. In some embodiments, measuring the distance between the surface and the transducer may comprise using an optical sensor and a laser to measure the distance.

In some embodiments, applying an oscillating acoustic force to the cleaning liquid by actuating the transducer may comprise applying an alternating current and voltage to the transducer. In some embodiments, the frequency of the alternating current and voltage is kept substantially constant.

In some embodiments, the measured value may be a phase shift between the alternating current and voltage applied to the transducer. In these embodiments, the desired value may be a desired phase shift, such as zero.

In some embodiments, the transducer may be mounted in a nozzle. The nozzle may be operable to produce a liquid column between the nozzle and the surface. In other embodiments, the transducer may be mounted against a sidewall of a reservoir configured to be filled with the cleaning liquid and to receive the substrate for submersion in the cleaning liquid.

In some embodiments, moving the transducer relative to the substrate may comprise moving the transducer, and alternately or additionally moving the substrate relative to the transducer. For example, the substrate may be rotated.

This disclosure is equally related to an apparatus for cleaning a surface of a substrate. In some embodiments, the apparatus may comprise a piezoelectric transducer, a support operable to position a substrate at a controllable distance from the transducer, means for providing a cleaning liquid between the transducer and the substrate, means for measuring a value indicating a distance between a surface of the substrate and the transducer, and a feedback loop operable to control the measured value such that the measured value remains substantially equal to a desired value.

In some embodiments, the means for providing the cleaning liquid may comprise a nozzle. In these embodiments, the transducer may be mounted in the nozzle, and the nozzle may be operable to produce a liquid column between the nozzle and the surface.

In other embodiments, the means for providing the cleaning liquid may comprise a reservoir in which the substrate may be submerged. In these embodiments, the transducer may be attached to a sidewall of the reservoir.

In some embodiments, the means for measuring the value indicating a distance between the surface of the substrate and the transducer comprises an optical sensor and a laser. In some embodiments, the measured value is the distance between the surface of the substrate and the transducer, and the desired value is the distance at which the PRE is at a maximum.

In some embodiments, the transducer is operable to receive an alternating current and voltage from a power source so as to actuate the transducer and apply an oscillating acoustic force to the cleaning liquid. In some embodiments, the measured value may be a phase shift between the alternating current and voltage, and the desired value may be a desired phase shift, such as zero.

Two possible setups in which the method may be applied are illustrated in FIG. 1. In the setup shown in FIG. 1A, a nozzle 1 is provided, which comprises a transducer 2. A supply 3 of cleaning liquid can be supplied to the nozzle 1, so that liquid streams out of the nozzle outlet 4, creating a liquid column 5 between the nozzle and the surface of the substrate 6 to be cleaned. Actuation of the transducer 2 generates acoustic waves which propagate in the liquid column 5. Actuation of the transducer 2 takes place through a power source to which the transducer 2 is connected. The power source may be, for example, a combination of a function generator and an amplifier. Other power sources are possible as well.

The nozzle 1 may be scanned over the surface of the substrate 6 and/or the substrate 6 may be moved with respect to the nozzle 1. For example, the nozzle 1 may move laterally above the substrate 6. Alternatively or additionally, the substrate 6 may, for example, be rotated. In any case, such relative movement between the nozzle 1 and the substrate 6 serves to clean the surface of the substrate 6.

Figure 1B:
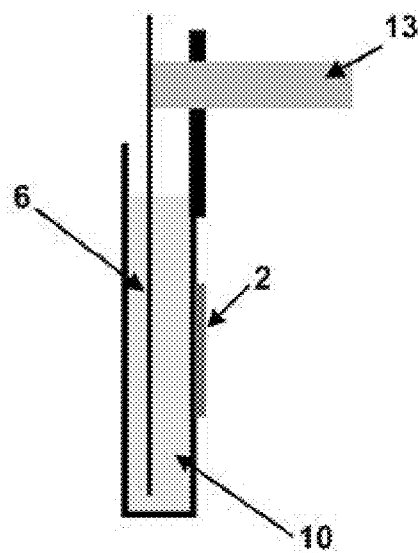
FIG. 1B depicts a small cell system.

The setup shown in FIG. 1B depicts a megasonic cell. The megasonic cell is shown comprising a reservoir 10 that may be filled with a cleaning liquid, and in which the substrate 6 to be cleaned may be submerged. A transducer 2 is attached to a side wall of the reservoir 10. The transducer 2 may be, for example, the same type of transducer as used in the setup shown in FIG. 1A. A micrometer screw 13 is provided for test purposes, as described below. The micrometer screw 13 allows for performing measurements with different distances between the substrate 6 and the transducer 2.

A power source (not shown) provides a high frequency voltage and current to the transducer 2. The impedance of the transducer 2 can be measured by measuring this voltage and current, and the impedance is highest when the phase shift between voltage and current is at a minimum. As known in the art, this is the condition at which the highest cleaning efficiency is obtained. This condition corresponds to the resonance frequency of the transducer system.

We may now consider FIG. 2. FIG. 2 shows the impedance and phase measurements of the transducer as a function of the frequency. The results shown in FIG. 2A are impedance measurements obtained with the setup shown in FIG. 1B. The four graphs shown in this figure correspond to four separate distances (1 mm, 1.3 mm, 1.6 mm and 1.9 mm) between the transducer and the surface of the substrate. A half-wavelength of a 1 MHz sound field in water corresponds to approximately 0.75 mm. The substrate was a standard silicon wafer.

Attention may be drawn primarily to the amplitude spectrum, shown as black curves. What is apparent is not only that the resonance frequency (and the number of resonance frequencies) changes as a function of the distance between the transducer and the substrate, but also that the shape and height of the highest resonance peak changes. These latter features are directly related to the cleaning efficiency. By consequence, even if the frequency of the voltage and current supplied to the transducer is varied to comply with a resonance condition (as in prior art systems), a variation of the distance between the transducer and the substrate (due to a topography of the surface to be cleaned or a curvature of said surface) may lead to considerable variations in cleaning efficiency.

According to an embodiment of the method disclosed herein, the frequency may be maintained substantially constant, while the distance between the transducer and the surface is controlled to remain as close as possible to a predefined set value, by measuring the distance directly or by measuring the phase shift between the current and voltage and applying the measured values in a feedback loop. In this way, only one of the graphs of FIG. 2A applies throughout the cleaning process, which ensures a constant optimal cleaning efficiency.

The graphs in FIG. 2B are measurements taken from an experimental setup in which the wafer of FIG. 2A was replaced by a damping material. The damping material greatly reduces acoustic reflections. By comparing measurements from setups using both the wafer (larger acoustic reflections) and the damping material (smaller acoustic reflections), it can be seen that the reflections have an important effect on the resonance frequency. One can see that the relationship between frequency and impedance is much more stable in FIG. 2B that in FIG. 2A. However, the situation to which the method of the invention is mainly applicable is the situation where an actual wafer is cleaned, as shown in the graphs of FIG. 2A.

The desired distance between the transducer and the surface is the distance at which the particle removal efficiency is at a maximum. This can also be expressed by saying that the desired distance is the distance at which the real power consumed by the transducer is at a maximum, the real power being equal to the dissipated acoustical power in the liquid. As explained in the paragraph below on test results, a strong dependency has been established between PRE and real power on the one hand and on the other hand the distance between the transducer and the substrate surface to be cleaned.

In conventional, state of the art setups for acoustic cleaning, the distance between the reflecting surface and the transducer is not constant as scanning proceeds, due to mechanical tolerances, imperfect geometry, non-flatness of the substrate. This is the case in, for example, the system described in WIPO Application Pub. No. WO-A-2004071938 (Boyd et al.)

In contrast to the prior art, the present disclosure describes an apparatus in which a vertical positioning gear adjusts the distance between the transducer and the (reflecting) surface while scanning proceeds, such that the phase shift between voltage and current is kept constant, and preferably zero. This is equivalent to maintaining the distance between the substrate and the transducer equal to a desired distance (i.e. the desired distance is the distance at which, at the frequency of the power source, the phase shift between voltage and current is equal to a predefined value, preferably zero). This can be achieved using a feedback control system that compares the measured phase shift to the desired value and feeds correction into a vertical positioning gear, thereby adjusting the distance between the transducer and the reflecting surface. This gear could be, for example, electromagnetically driven.

In some applications of this apparatus, maximum active (real) power is desired. In such an application, the feedback control system may minimize the absolute value of the phase shift angle between voltage and current, and will feed the corresponding correction into a vertical positioning gear, thereby adjusting the distance between the transducer and the reflecting surface. Alternatively, a control system can maximize the active (real) power by controlling the distance between the transducer and the reflecting surface. In some embodiments of the disclosure, a single transducer may scan the entire surface. Cleaning chemicals may be delivered to the wafer through (spray) nozzle(s) above the wafer. Alternatively, in other embodiments, a set of multiple transducers may be used in parallel to treat at least a part of the surface, or the entire surface at once.

Figure 3:
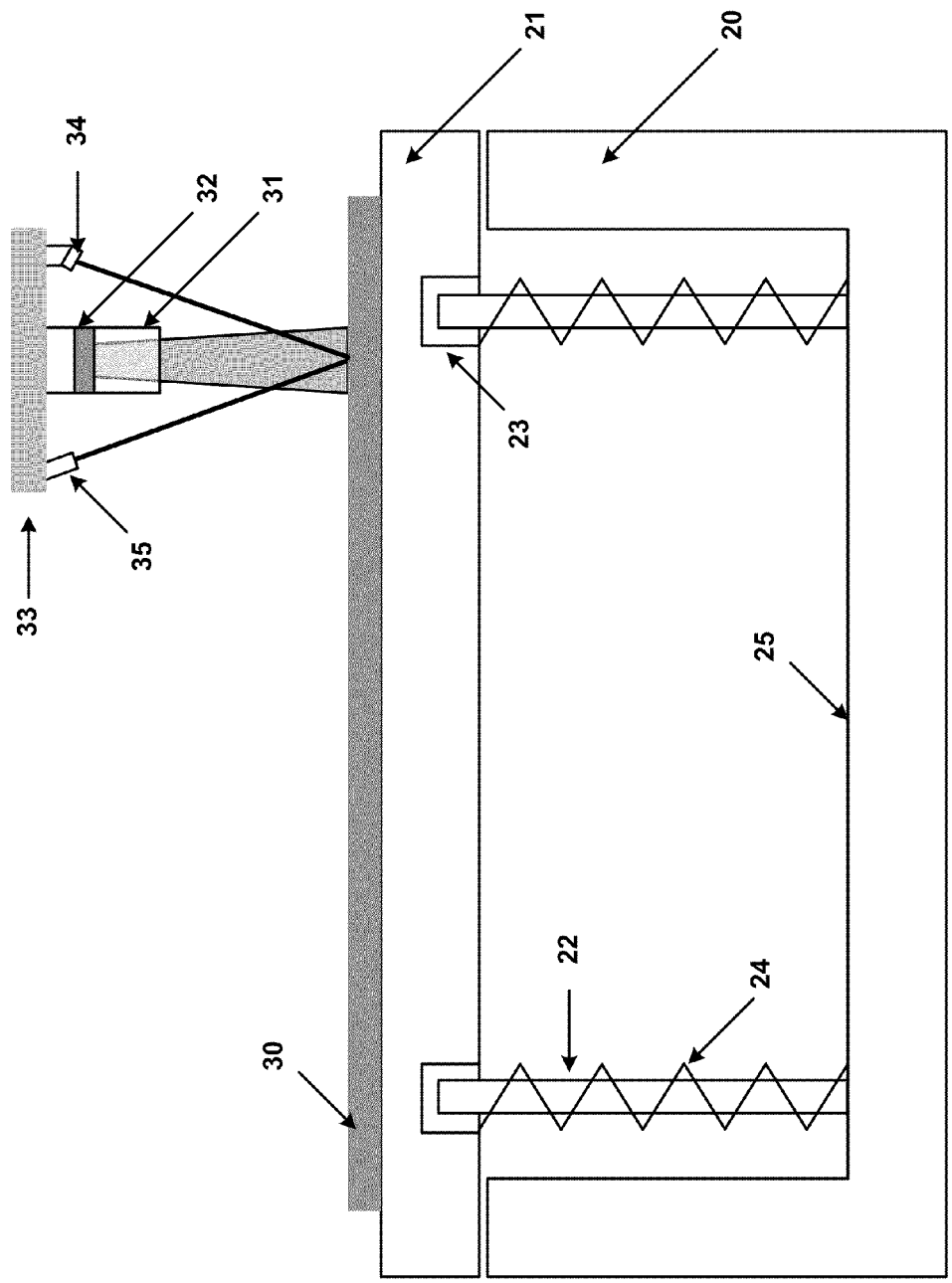
FIG. 3 illustrates an example apparatus according to an embodiment of the invention.

FIG. 3 illustrates an example apparatus according to an embodiment of the invention. The apparatus is shown comprising an electromagnet 20, and a wafer support table 21 supported on support legs 22. The support table 21 is vertically movable with respect to the support legs 22, via linear bearings 23, with springs 24 arranged between a base 25 and the support table 21. These parts define a magnetic levitation system: the magnet 20 is connectable to a power source, and actuation of the magnet 20 will cause an attraction or repulsion between the magnet 20 and the support table 21, against the bias of the springs 24. In this way, vertical movement of the support table 21 can be actuated.

A substrate 30, such as a silicon wafer, may be positioned on the support table 21. A nozzle 31, comprising a transducer 32, is mounted on a movable structure 33 that can move in the direction parallel to the surface of the substrate 30.

The movable structure 33 is shown further comprising an optical sensor 34 and a laser 35. The optical sensor 34 may be, for example, a position-sensitive photodetector and the laser 35 may produce a focused light beam. The optical sensor 34 and the laser 35 are operable to measure the distance change between the wafer 30 and the transducer 32. The optical sensor 34 and laser 35 may be collectively referred to as the optical distance measurement system. The optical distance measurement system is mounted on the same structure 19 as the nozzle 31 and transducer 32 and, as a result, it follows the movement of the transducer 32.

A feedback loop is provided between the optical distance measurement system and the magnetic levitation system of the wafer. The feedback loop may receive a distance measurement from the optical distance measurement system, and may then use the received distance measurement to perform a distance correction using the magnetic levitation system. The details of the apparatus of FIG. 3 can be according to known technologies, described for example in the following documents:

"The laser displacement measurement with feedback control in a magnetic levitation and suspension system", Lin et al, Comput. Methods Appl. Mech. Engrg. 190 (2000) 25-34.

"Robust force control for a magnetically levitated manipulator using flux density measurement", Yi et al, Control Eng. Practice, Vol 4, No 7, pp. 957-965, 1996.

The apparatus shown in FIG. 3 is merely an example apparatus suitable for performing the method of the invention. For example, the magnetic levitation system may be configured to actuate the movement of the nozzle and transducer instead of the wafer. Instead of an optical sensor and a laser, an acoustical sensor could be used for the distance measurement. As described before, the phase signal between voltage and current signals could also be used as an input for the feedback loop to keep the distance between wafer and transducer at the desired value for a substantially constant frequency.

Test Results

Tests were performed to observe the influence of acoustic reflections on the electrical properties of a transducer. In this section, details of the experimental setups and results are provided.

The two different megasonic tools used to demonstrate the effect of acoustic reflections on the performance of a transducer in this section are those shown schematically in FIG. 1 and described above. In particular, the first experimental system is that shown in FIG. 1A, and the second experimental system is that shown in FIG. 1B.

All of the tests described here have been performed with an apparatus that involves a face-to-face configuration between the transducer and the wafer or damping material (throughout this disclosure the damping material is made of Aptflex F28, 1.5 mm thick). Additionally, all results in this disclosure are obtained with a nozzle speed of 50 cm/min, a wafer rotation of 1000 rpm and a water flow of 1.5 l/min. The water was saturated with $O_2$ gas.

The first experimental system is a 200 mm single wafer megasonic tool and is represented schematically in FIG. 1A. A 1 MHz megasonic nozzle is moved at a constant speed over the rotating wafer, and will be referred to as the nozzle system. The active diameter of the cylindrical megasonic transducer is 11 mm. As the liquid flows out of the exhaust port of the nozzle, the acoustic waves propagate within the resulting liquid-column. The acoustic waves converge to a point in the vicinity of the exhaust port, which is about 4 mm below the exhaust. The height of the nozzle can be adjusted with an accuracy of 10 μm with respect to the center of the wafer. The cleaning liquid is de-ionized water (DIW) with a controlled amount of dissolved $O_2$ gas.

The second system is a small megasonic cell with the same type of transducer mounted to a glass cell and is represented schematically in FIG. 1B. The liquid is DIW and the dissolved gases are not controlled. The inner dimensions of the cell are $4\times20\times40$ $mm^3$ and a sample piece of thin damping material can be immersed in the cell.

The transducers of both systems are driven by a combination of a function generator and an amplifier. The electrical signals delivered to the transducers are measured with a current-and-voltage probe that is directly connected to an oscilloscope. Furthermore, the piezoelectric transducer of the cell (as depicted in FIG. 1B) is also characterized by impedance analyzer measurements. The electrical impedance measurements are made with an Agilent HP 4294 impedance analyzer.

Measurements from the test illustrate the influence of acoustic reflections on the electrical properties of a transducer. Electrical measurements can estimate the resonance frequency of the transducer and the acoustical power delivered to the liquid. The impedance analyzer measurements can be influenced by reflections and acoustical standing waves in the propagating medium. For the electrical impedance measurements, a wafer piece or a thin slice of damping material is placed in front of the transducer at a distance of only a few millimeters.

Measurements of the impedance and phase as a function of the frequency are shown in FIG. 2. The left and right axes show the impedance and phase, respectively. FIG. 2A represents the measurements when a wafer piece is present, and FIG. 2B shows the tests with a thin slice of damping material in front of the transducer. The damping material significantly reduces acoustic reflections. In both cases, the distance to the transducer is varied. Typical results are shown in FIG. 2.

The duration of each measurement point is sufficiently long so that a standing wave between the wafer and transducer is developed. The real part of the impedance and the phase angle are measured in the frequency range of 0.9 to 1.1 MHz in steps of 0.5 kHz. The measurements clearly show an influence of reflected acoustic waves on the impedance and phase data.

The impact of acoustic reflections on the resonance frequencies can be seen by comparing the measurements shown in FIGS. 2A and 2B. FIG. 2B illustrates measurements taken using a damping material to significantly reduce the acoustic reflections. On the other hand, FIG. 2A illustrates measurements taken using a wafer. This case involves much more significant acoustic reflections, and further is more applicable to many applications.

In FIG. 2B, only one resonance peak for both phase and impedance can be detected, which is the fundamental resonance of the transducer. The frequency-offset between the phase and impedance data is attributed to the parasitic capacitance of the transducer that is resulting from the small thickness of the piezoceramic and its high dielectric constant. Additionally, the full width at half maximum (FWHM) of the impedance peak in the graphs of FIG. 2B is quite large (around 40 kHz). Due to its thinness, the damping material is not able to completely absorb all of the acoustic waves. Nevertheless, the variation of the distance between the transducer and damping material still has only a minor effect on the impedance peak. It can be seen that the width and position of the impedance peak vary only slightly.

By contrast, if a wafer piece is present instead of damping material, as is the case in FIG. 2A, acoustic reflections are much greater, and it can be seen that the impedance peaks change drastically. At several wafer positions, more than one impedance or phase peak is present. The FWHM of the impedance peak is much smaller (~15 kHz) compared to the case when the damping material is used. The existence of several resonance peaks at certain wafer positions can make it difficult to use a feedback loop that corrects for a shift of the resonance frequency. Thus, it can be seen that the acoustic reflections have a large impact on the resonance frequencies of a transducer.

The resonance dependence of the transducer on the reflection of acoustic waves was further investigated by connecting the small cell to an amplifier/function generator setup. For each position of the damping material or wafer piece, the frequency that corresponds to a zero phase shift between the voltage and current signal was plotted. These results are shown in FIG. 4.

Figure 4A:
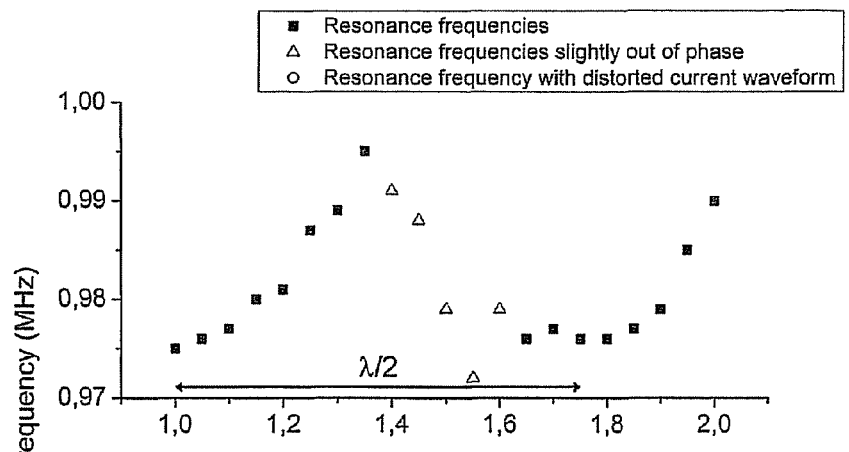
FIG. 4A depicts the frequencies for a damping material.

Both pictures in FIG. 4 show a clear periodicity, which corresponds to half of the wavelength of the acoustic waves. In FIG. 4A, the resonance frequency is plotted as function of the distance between the damping material and the transducer. In every case, only one resonance frequency present. However, a zero phase shift could not be obtained completely for all damping material positions. The origin of this non-zero phase shift is a clamping capacitance that is associated with a transducer element. During the measurements, the clamping capacitance was not corrected for, which means that the real resonance frequency lies not exactly at a zero phase shift.

Figure 4B:
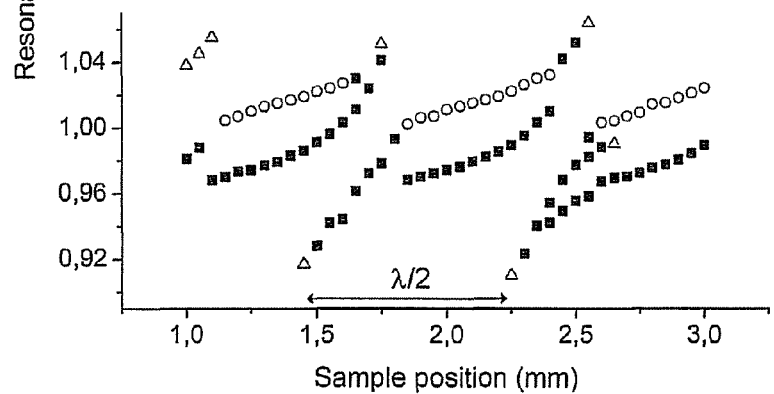
FIG. 4B depicts the frequencies for a wafer piece.

In FIG. 4B, the damping material is replaced by a wafer piece. The difference between the pictures in FIG. 4A and 4B makes clear the huge impact of acoustic reflections back into a transducer. At certain positions of the wafer, several resonance frequencies are present. It is even possible that the current waveform is clearly distorted (several frequencies present in the Fourier transform of the signal) for some resonance frequencies.

Figure 5:
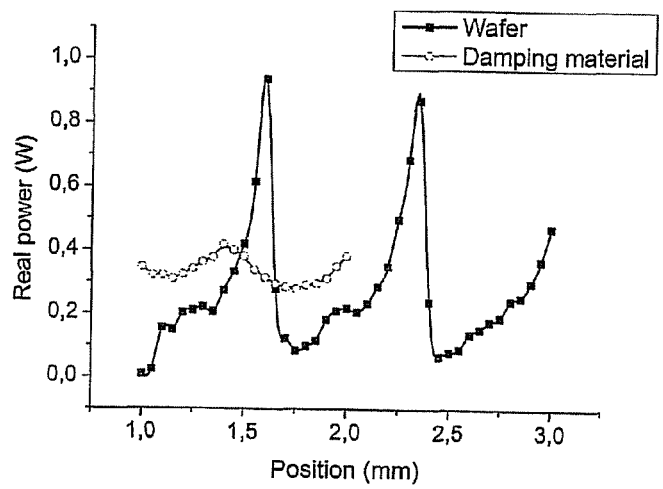
FIG. 5 shows the real power delivered to the transducer as a function of the position of the wafer and damping material.

FIG. 5 represents the evolution of the real power as a function of the distance between the transducer and both the damping material and the wafer. Measurements taken using the damping material are illustrated by gray circles, and measurements taken using the wafer are illustrated by solid squares. The real power is equal to the dissipated acoustical power in the liquid. It is clear that real power, like resonance frequency, is similarly strongly affected by acoustic reflections.

For the case of the wafer, the dependence of the real power as a function of the variation of the distance between the wafer surface and the transducer is shown. A very strong oscillation of the real power can be observed when acoustic reflections are present.

For the case of the damping material, the dependence of the real power as a function of the variation of the distance between the damping material and the transducer is shown. In this case, the oscillation is still present, but clearly reduced. A small oscillation of the real power can still be observed due to the thinness of the damping material and its corresponding inability to absorb all the acoustic waves. Thus, real power is shown to depend strongly on the level of acoustic reflections.

In addition to resonance frequency and real power, the influence of acoustic reflections on Particle Removal Efficiency (PRE) has also been investigated. The measurements were performed with the nozzle system described in FIG. 1A. The nozzle was driven with a function generator (peak-to-peak voltage of 2.05 V at a frequency of 1.02 MHz) and a high frequency amplifier (gain 100×). The removal of particles is evaluated for 78 nm of $SiO_2$ particles deposited on a Si wafer and aged for 2 hours in a relative humidity of 40%.

Cleaning performance may be evaluated by measuring local PRE using light scattering in the haze mode. FIG. 6 shows a nozzle setup as well as a pattern obtained with the nozzle setup, indicating the cleaning performance. FIG. 6A illustrates a cross section of the nozzle set-up in accordance with an embodiment of the invention. FIG. 6B represents a typical non-uniform PRE pattern obtained with the nozzle set-up.

It can be seen from FIG. 6A that the wafer is slightly bent as a result of standing waves. This bend in the wafer causes the radial non-uniformity in the PRE measurement shown in FIG. 6B. The bend in the wafer changes the face-to-face distance between the transducer and wafer. This variation influences the dissipated acoustical power, as was seen in FIG. 5.

In general, the effective size of the transducer is defined as the area over which acoustic waves impinge on the surface and within which the major power (a substantial amount of the power) of the acoustic wave is confined. In the embodiments wherein the surface to be cleaned is non-planar, as shown in FIG. 6A, the effective size of the transducer has to be chosen in relation to the non-planarity of the surface, such that at any position of the transducer facing the surface a clear distance value can be defined. This implies that the variation in distance between the transducer and the surface over the effective area of the transducer is small compared to the wavelength of the non-planar surface.

Figure 7A:
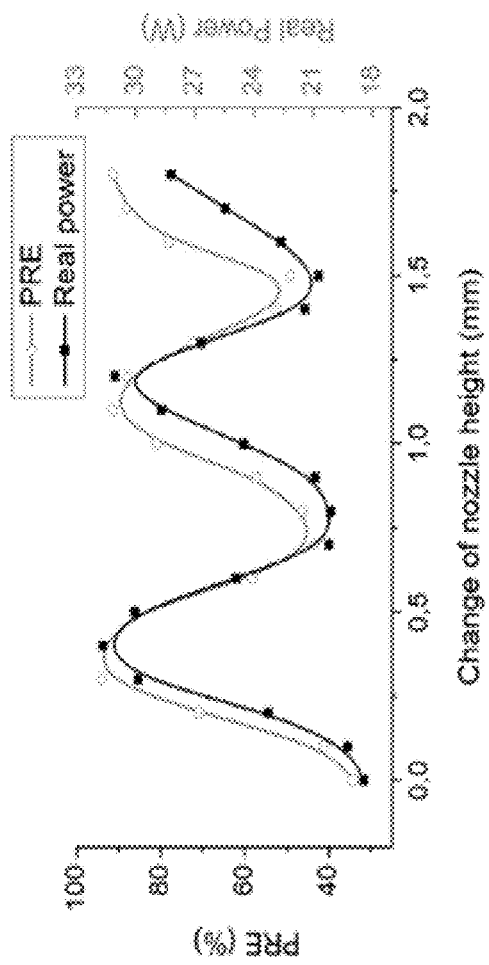
FIG. 7A shows the fluctuation of the real power delivered to the transducer and the PRE as a function of the distance between the transducer and the wafer.

To confirm this correlation, PRE maps were recorded in combination with electrical measurements. FIG. 7 shows experimental data related to real power PRE. In particular, FIG. 7A shows the fluctuation of the real power delivered to the transducer and the PRE as a function of the distance between the transducer and the wafer, and FIG. 7B shows the correlation between the PRE and the real power.

In taking these measurements, the nozzle was positioned above the centre of the wafer and the real power was measured at several wafer heights (distances between the wafer surface and the transducer). Next, a PRE wafer map was recorded for each nozzle height (corresponding to the distance between the wafer surface and the transducer fixed on said nozzle). An average PRE in the centre of the wafer (circle with radius of 1 cm as shown in FIG. 6) was calculated. FIG. 7A shows a strong oscillatory response of the real power and the PRE as a function of the transducer to wafer distance.

Figure 7B:
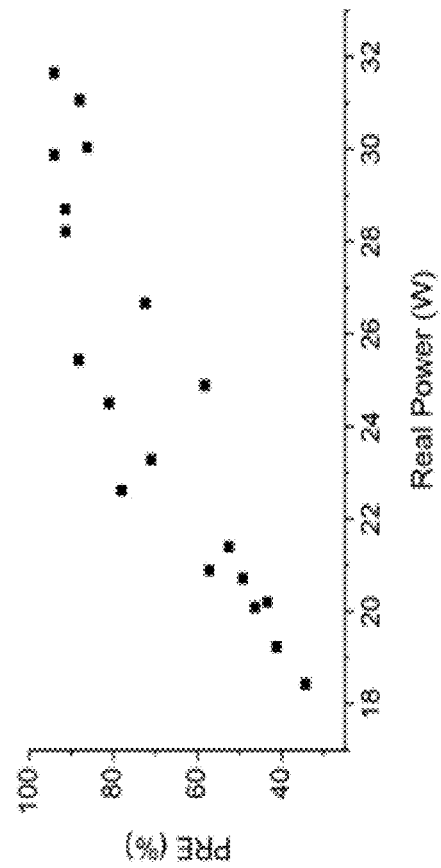
FIG. 7B shows the correlation between the PRE and the real power.

FIG. 7B shows a similar trend for the PRE and the real power. Both curves are correlated and oscillate with half of a wavelength of the acoustic waves. As a result, a direct correlation between reflected acoustic waves and particle removal efficiency data is established.

The acoustic reflections change the part of the electrical input impedance which is subject to electro-acoustical coupling described by eq. (1) and (2). This immediately influences the real electrical power delivered to the transducer, and thus the acoustical power delivered to the liquid. The observed oscillatory PRE response can thus be attributed to the oscillatory dependence of the power transmitted to the liquid.

The present disclosure reveals that reflected acoustic waves have a large impact on the performance of a transducer.

In order to obtain an efficient cleaning, it is required to control the reflection of acoustic waves. By selecting and controlling the distance between wafer and transducer (resonance condition) according to the teaching of the present disclosure, the reflection of acoustic waves back into the transducer will enhance the real power consumed by the transducer. Further, enhancing the real power consumed by the transducer determines an increase of the dissipated acoustical power in the cleaning liquid and an improvement of the PRE.

In the detailed description, numerous specific details have been set forth in order to provide a thorough understanding of the particular embodiments and how they may be practiced. However it will be understood that the present embodiments may be practiced without these specific details. In other instances, well-known methods, procedures and techniques have not been described in detail, so as not to obscure the present embodiment. While the present embodiments are described with respect to with reference to certain drawings, the reference is not limited hereto. The drawings included and described herein are schematic and are not limiting. It is also noted that in the drawings, the size of some elements may be exaggerated and, therefore, not drawn to scale for illustrative purposes.

Furthermore, the terms first, second and the like in the description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. In addition to the disclosed embodiments, numerous other embodiments and configurations are possible and within the scope of the claims.

Moreover, the terms top, bottom, over, under and the like in the description are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The invention claimed is:

1. A method comprising:
   positioning a substrate at a first distance from a piezoelectric transducer;
   supplying a cleaning liquid between the substrate and the transducer;
   applying an oscillating acoustic force to the cleaning liquid by actuating the transducer,
   wherein actuating the transducer includes applying an alternating current and voltage to the transducer;
   measuring a first phase shift between the alternating current and the voltage while the substrate is positioned at the first distance from the transducer;
   moving the transducer relative to the substrate, thereby causing the substrate to be positioned at a second distance from the transducer;
   measuring a second phase shift between the alternating current and the voltage while the substrate is positioned at the second distance from the transducer,
   determining whether the second phase shift is different from the first phase shift measured, and
   based on the determination that the second phase shift is different from the first phase shift, adjusting the second distance towards the first distance to adjust the second phase shift towards the first phase shift.

2. The method of claim 1, wherein the substrate is a semiconductor substrate.

3. The method of claim 1, wherein the first distance comprises a distance at which a particle removal efficiency (PRE) is at a maximum.

4. The method of claim 1, further comprising:
   measuring the first and second distances comprises using an optical sensor and a laser.

5. The method of claim 1, wherein the first phase shift is equal to zero.

6. The method of claim 1, wherein the transducer is mounted in a nozzle operable to supply the cleaning liquid.

7. The method of claim 4, wherein the measured first phase shift between the alternating current and voltage corresponds to a first impedance of the transducer during the application of the oscillating acoustic force.

8. The method of claim 5, wherein the transducer is mounted against a side wall of a reservoir configured to be filled with the cleaning liquid and to receive the substrate for submersion in the cleaning liquid.

9. The method of claim 6, wherein the nozzle being operable to supply the cleaning liquid comprises being operable to produce a liquid column of the cleaning liquid between the nozzle and the substrate.

10. A method comprising:
    positioning a substrate at a first distance from a piezoelectric transducer;
    supplying a cleaning liquid between the substrate and the transducer;
    applying an oscillating acoustic force to the cleaning liquid by actuating the transducer, wherein actuating the transducer comprises applying an alternating current and a voltage to the transducer;
    moving the transducer relative to the substrate, thereby causing the substrate to be positioned at a second distance from the transducer;
    measuring a phase shift between the alternating current and the voltage while the substrate is positioned at the second distance from the transducer;
    determining whether the phase shift is different from zero; and
    based on the determination that the phase shift is different from zero, adjusting the second distance to adjust the phase shift towards zero.

11. The method of claim 10, wherein adjusting the phase shift towards zero comprises adjusting the second distance towards a distance at which a particle removal efficiency is at a maximum.

12. The method of claim 10, further comprising measuring the first and second distances using an optical sensor and a laser.

* * * * *